(12) United States Patent
Shon et al.

(10) Patent No.: US 10,601,220 B2
(45) Date of Patent: Mar. 24, 2020

(54) WINDOW CONTROL DEVICE FOR A VEHICLE AND A METHOD THEREFOR

(71) Applicants: HYUNDAI MOTOR COMPANY, Seoul (KR); KIA MOTORS CORPORATION, Seoul (KR); DY AUTO Corporation, Asan-si, Chungcheongnam-do (KR)

(72) Inventors: Kyong Ho Shon, Seoul (KR); Kil Sang Cho, Suwon-si (KR); Sug Woo Shin, Suwon-si (KR); Baek Yong Kim, Incheon (KR); Bo Sung Jo, Seoul (KR); Chang Seong Kim, Seoul (KR)

(73) Assignees: HYUNDAI MOTOR COMPANY, Seoul (KR); KIA MOTORS CORPORATION, Seoul (KR); DY AUTO Corporation, Seoul (KR)

( * ) Notice: Subject to any disclaimer, the term of this patent is extended or adjusted under 35 U.S.C. 154(b) by 0 days.

(21) Appl. No.: 15/677,831

(22) Filed: Aug. 15, 2017

(65) Prior Publication Data
US 2018/0301893 A1    Oct. 18, 2018

(30) Foreign Application Priority Data
Apr. 14, 2017   (KR) .......................... 10-2017-0048418

(51) Int. Cl.
*H02H 7/085*   (2006.01)
*B60J 7/057*   (2006.01)
(Continued)

(52) U.S. Cl.
CPC ............. *H02H 7/0851* (2013.01); *H02P 7/00* (2013.01); *H02P 7/063* (2013.01);
(Continued)

(58) Field of Classification Search
CPC ......... H02H 7/0851; B60J 5/00; B60J 7/0573; H02P 6/12; G05D 3/125
See application file for complete search history.

(56) References Cited

U.S. PATENT DOCUMENTS 6,426,604 B1 * 7/2002 Ito ...................... G05B 19/4062
                                                        160/293.1
6,646,398 B1   11/2003 Fukazawa et al.
(Continued)

FOREIGN PATENT DOCUMENTS

JP          10317791         12/1998
JP         2007092292         4/2007
(Continued)

*Primary Examiner* — Cortez M Cook
(74) *Attorney, Agent, or Firm* — Lempia Summerfield Katz LLC

(57) ABSTRACT

A window control device for a vehicle, and a method therefor, include a driving motor configured to drive a window glass, a first sensor configured to generate one pulse signal corresponding to a rotation of the driving motor, a second sensor configured to sense a voltage signal provided to the driving motor, and a controller configured to perform a safety function based on the one pulse signal generated by the first sensor and the voltage signal sensed by the second sensor. Although a fault occurs in one of two hall sensors, the window control device may normally perform the safety function.

7 Claims, 5 Drawing Sheets

(51) Int. Cl.
  *G05D 3/12*      (2006.01)
  *H02P 7/06*      (2006.01)
  *H02P 7/00*      (2016.01)
  *H02P 29/024*    (2016.01)
  *H02H 3/05*      (2006.01)
  *H02H 7/08*      (2006.01)

(52) U.S. Cl.
  CPC ......... *H02P 29/0241* (2016.02); *B60J 7/0573* (2013.01); *G05D 3/125* (2013.01); *H02H 3/05* (2013.01); *H02H 7/0844* (2013.01); *H02P 2203/05* (2013.01); *H03K 2217/960705* (2013.01)

(56) References Cited

U.S. PATENT DOCUMENTS

| | | | |
|---|---|---|---|
| 7,830,107 B2 | 11/2010 | Inoue et al. | |
| 2003/0140565 A1* | 7/2003 | Otomo | B60J 7/0573 49/360 |
| 2004/0212338 A1* | 10/2004 | Shimizu | H02H 7/0851 318/469 |
| 2006/0061314 A1* | 3/2006 | Shinohara | H02H 7/0851 318/466 |
| 2011/0043146 A1* | 2/2011 | Sato | H02P 6/12 318/400.04 |
| 2014/0109478 A1* | 4/2014 | Mori | B60J 5/00 49/26 |

FOREIGN PATENT DOCUMENTS

| | | |
|---|---|---|
| JP | 2010019020 | 1/2010 |
| JP | 2011122369 | 6/2011 |
| KR | 100976394 | 8/2010 |

\* cited by examiner

WINDOW CONTROL DEVICE FOR A VEHICLE AND A METHOD THEREFOR

CROSS-REFERENCE TO RELATED APPLICATION

This application is based on and claims the benefit of priority to Korean Patent Application No. 10-2017-0048418, filed on Apr. 14, 2017, in the Korean Intellectual Property Office, the disclosure of which is incorporated herein in its entirety by reference.

TECHNICAL FIELD

The present disclosure relates to a window control device for a vehicle and a method therefor, and more particularly, relates to technologies for normally performing a safety function although a fault occurs in a power window system.

BACKGROUND

In general, a power window system mounted on a vehicle may have a switch and a driving motor. The power window system may control the driving motor to raise or lower a window glass of the vehicle based on the operation of the switch by the driver. Thus, the driver may easily open and close the window glass of the vehicle to a desired position by only a simple operation of the switch.

Meanwhile, when the driver closes a window glass by a back seat using the switch in the vehicle, an accident may occur. For example, a body portion, such as a finger, an arm, a head, or a neck of a person in the back seat or an object may be caught between the window glass and a doorframe of the vehicle.

As such, a power window system may have a safety function. A safety function has been developed to automatically stop raising the window glass, or to automatically inversely lower the window glass, if an obstacle is detected while the window glass is being raised to protect the obstacle.

Such a power window system may have a ring magnet fixed to a rotating shaft of a driving motor and may have two hall sensors. The two hall sensors may have a phase difference of 90 degrees from each other around the periphery of the ring magnet. The power window system may determine a speed (raising speed), a location (raised or lowered height position), and a direction (raising or lowering direction) of a window glass based on two pulse signals detected by the two hall sensors and may perform the safety function.

In this case, if a fault occurs in one of the two hall sensors, since the power window system may fail to detect a movement direction of the window glass because only one pulse signal is generated, it may fail to perform the safety function. The conventional power window system may fail to cope with these conditions.

In other words, if a fault occurs in one of the two hall sensors, the conventional power window system may detect a speed of the window glass based on one pulse signal generated by the one hall sensor, but may fail to detect a location and a direction of the window glass. As a result, the conventional power window system may fail to perform the safety function.

SUMMARY

The present disclosure has been made to solve the above-mentioned problems occurring in the prior art while advantages achieved by the prior art are maintained intact.

An aspect of the present disclosure provides a window control device for a vehicle for normally performing a safety function. The safety function is performed although a fault occurs in one of two hall sensors. The safety function is performed based on a pulse signal generated by one hall sensor and a voltage signal provided to a driving motor. Another aspect of the present disclosure provides a method therefor.

The technical problems to be solved by the present inventive concept are not limited to the aforementioned problems. Any other technical problems not mentioned herein will be clearly understood from the following description by those having ordinary skill in the art to which the present disclosure pertains.

According to an aspect of the present disclosure, an apparatus may include a driving motor configured to drive a window glass, a first sensor configured to generate one pulse signal corresponding to a rotation of the driving motor, a second sensor configured to sense a voltage signal provided to the driving motor, and a controller configured to perform a safety function based on the one pulse signal generated by the first sensor and the voltage signal sensed by the second sensor.

The controller may be configured to determine whether the voltage signal provided to the driving motor is a voltage signal for a forward rotation of the driving motor or a voltage signal for a reverse rotation of the driving motor and detect a direction of the window glass, calculate a speed of the window glass using the one pulse signal, and detect a real-time location of the window glass based on the speed of the window glass and the direction of the window glass by storing a current location of the window glass.

The controller may be configured to determine that an obstacle is caught if a raising speed of the window glass is less than or equal to a threshold value while the window glass is raised and perform the safety function. The safety function may refer to changing the direction of and lowering the window glass, which is being raised.

The controller may be configured to monitor whether the driving motor changes the direction of and lowers the window glass, which is being raised, when performing the safety function, and, if the window glass, which is being raised, is not lowered, then perform the safety function again.

According to another aspect of the present disclosure, a method may include generating, by a first sensor, one pulse signal corresponding to a rotation of a driving motor, which drives a window glass, sensing, by a second sensor, a voltage signal provided to the driving motor, and performing, by a controller, a safety function based on the generated one pulse signal and the sensed voltage signal.

The performing of the safety function may include determining whether the voltage signal provided to the driving motor is a voltage signal for a forward rotation or a voltage signal for a reverse rotation and detecting a direction of the window glass, calculating a speed of the window glass using the one pulse signal, detecting a real-time location of the window glass based on the speed of the window glass and the direction of the window glass, determining that an obstacle is caught if a raising speed of the window glass is less than or equal to a threshold value while the window glass is raised, and performing the safety function. The safety function may refer to changing the direction of and lowering the window glass, which is being raised.

The method may further include monitoring, by the controller, whether the driving motor lowers the window glass, which is being raised, when the controller performs the safety function. If the window glass, which is being raised, is not lowered, the controller may perform the safety function again.

According to another aspect of the present disclosure, an apparatus may include a driving motor configured to drive a window glass, a first hall sensor configured to generate a first pulse signal corresponding to a rotation of the driving motor, a second hall sensor configured to generate a second pulse signal corresponding to a rotation of the driving motor, a voltage sensor configured to sense a voltage signal provided to the driving motor, and a controller configured to perform a safety function based on any one of the first pulse signal generated by the first hall sensor and the second pulse signal generated by the second hall sensor and the voltage signal sensed by the voltage sensor.

The controller may be configured to, if a fault occurs in the first hall sensor, perform the safety function based on the second pulse signal generated by the second hall sensor and the voltage signal sensed by the voltage sensor.

The controller may be configured to determine whether the voltage signal provided to the driving motor is a voltage signal for a forward rotation of the driving motor or a voltage signal for a reverse rotation of the driving motor and detect a direction of the window glass, calculate a speed of the window glass using the second pulse signal, and detect a real-time location of the window glass based on the speed of the window glass and the direction of the window glass by storing a current location of the window glass.

The controller may be configured to determine that an obstacle is caught if a raising speed of the window glass is less than or equal to a threshold value while the window glass is raised and control the driving motor to change the direction of and lower the window glass, which is being raised.

The controller may be configured to monitor whether the driving motor lowers the window glass, which is being raised, when performing the safety function and, if the window glass, which is being raised, is not lowered, perform the safety function again.

BRIEF DESCRIPTION OF THE DRAWINGS

The above and other objects, features, and advantages of the present disclosure will be more apparent from the following detailed description taken in conjunction with the accompanying drawings where.

DETAILED DESCRIPTION

Hereinafter, embodiments of the present disclosure are described in detail with reference to the accompanying drawings. In adding reference symbols or denotations to elements of each drawing, although the same elements are displayed on a different drawing, it should be noted that the same elements have the same denotations. In addition, in describing an embodiment of the present disclosure, if it is determined that a detailed description of related well-known configurations or functions blurs the gist of an embodiment of the present disclosure, such description has been omitted.

In describing elements of embodiments of the present disclosure, the terms $1^{st}$, $2^{nd}$, first, second, A, B, (a), (b), and the like may be used herein. These terms are only used to distinguish one element from another element, but do not limit the corresponding elements irrespective of the nature, turn, or order of the corresponding elements. Unless otherwise defined, all terms used herein, including technical or scientific terms, have the same meanings as those generally understood by those having ordinary skill in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such a meaning in the present application.

Hereinafter, a speed of a window glass may refer to a speed when the window glass is opened or closed, i.e., lowered or raised, respectively. A direction of the window glass may be a direction in which the window glass is moved and may refer to opening and closing, i.e., lowering or raising, respectively, of the window glass. A location, i.e., a position, of the window glass may refer to an opening degree of the window glass, i.e., the degree to which the window glass is opened or closed.

Figure 1:
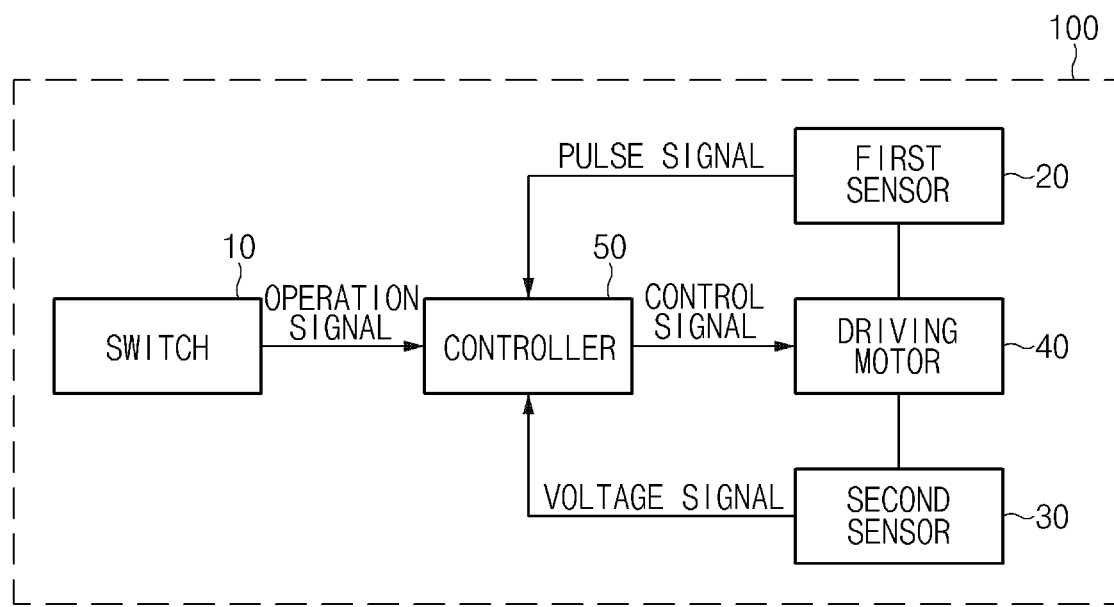
FIG. 1 is a block diagram illustrating a window control device for a vehicle according to an embodiment of the present disclosure.

FIG. 1 is a block diagram illustrating a window control device for a vehicle according to an embodiment of the present disclosure.

As shown in FIG. 1, a window control device 100 for a vehicle according to an embodiment of the present disclosure may include a switch 10, a first sensor 20, a second sensor 30, a driving motor 40, and a controller 50.

Referring to FIG. 1, the switch 10 may generate an operation signal for instructing raising, lowering, or stopping of a window glass based on an operation of a user. In this case, the user (a driver or a passenger) may operate the switch 10 to open or close the window glass.

An operation mode of the switch 10 may be an auto operation mode for completely opening or completely closing the window glass by one operation of pushing or pulling the switch 10. An operation mode of the switch 10 may be a manual operation mode for opening or closing the window glass only while the switch 10 continues being pulled or pushed. Thus, the switch 10 may generate an operation signal depending on the auto operation mode or an operation signal depending on the manual operation mode, based on an operation of the user.

The first sensor 20 may be a module having two hall sensors and one ring magnet and may generate two pulse signals corresponding to a rotation of the driving motor 40. In this case, the generated two pulse signals may have a phase difference of 90 degrees from each other.

Further, if a fault occurs in any one of the two hall sensors, the first sensor 20 may generate only one pulse signal. In this case, the generated pulse signal may be a pulse signal generated by the other of the two hall sensors of the first sensor 20, in which a fault does not occur.

For example, the second sensor 30 may be implemented as a voltage sensor and may sense voltage (a voltage signal) supplied to the driving motor 40. In other words, the second sensor 30 may measure a voltage signal for driving, supplied to the driving motor 40. In this case, the voltage signal may be implemented as a pulse width modulation (PWM) signal.

The driving motor 40 may be controlled by a control signal of the controller 50 to open or close the window glass through a forward rotation and a reverse operation. In this case, the control signal for controlling the driving motor 40 may be a control signal corresponding to an operation signal from the switch 10 during a normal operation and may be a control signal for performing a safety function if it is determined by the controller 50 that an obstacle is caught.

The controller 50 may perform an overall operation such that each of the elements normally performs its function.

Further, the controller 50 may control the driving motor 40 based on an operation signal received via the switch 10 during a normal operation and may control the driving motor 40 to perform a safety function if it is determined that an obstacle is caught.

Further, if two pulse signals are output from the first sensor 20 during an operation of the driving motor 40, the controller 50 may determine that the two hall sensors of the first sensor 20 are normal and may perform a safety function based on the two pulse signals. In this case, technology for calculating a speed, a location, and a direction of a window glass using the two pulse signals may use any scheme as general technology.

Further, if one pulse signal is output from the first sensor 20, and that one pulse signal is output during an operation of the driving motor 40, the controller 50 may determine that a fault occurs in one of the two hall sensors. In this case, the controller 50 may perform the safety function based on the one pulse signal output from the first sensor 20 and a voltage signal output from the second sensor 30.

Hereinafter, a description will be given of a process of performing the safety function based on the one pulse signal and the voltage signal.

First, the controller 50 may detect a direction (i.e., a movement direction) of a window glass based on the voltage signal output from the second sensor 30. For example, the controller 50 may determine whether a voltage signal provided to the driving motor 40 is a voltage signal for a forward rotation of the motor or a voltage signal for a reverse rotation of the motor to detect a direction of the window glass. Specifically, if a driving voltage input to a first port of the driving motor 40 is a plus (+) voltage and if a driving voltage input to a second port of the driving motor 40 is a minus (−) voltage, the controller 50 may determine that the window glass is raised. If a driving voltage input to the first port is a minus (−) voltage and if a driving voltage input to the second port is a plus (+) voltage, the controller 50 may determine that the window glass is lowered. For another example, if a driving voltage input to the first port is a plus (+) voltage and if a driving voltage input to the second port is a minus (−) voltage, the controller 50 may determine that the window glass is lowered. If a driving voltage input to the first port is a minus (−) voltage and if a driving voltage input to the second port is a plus (+) voltage, the controller 50 may determine that the window glass is raised.

Thereafter, the controller 50 may detect a location or position of the window glass based on a speed of the window glass, detected using one pulse signal, and based on the detected direction of the window glass. In this case, the speed of the window glass may be calculated by counting a pulse signal. Knowing the calculated speed of the window glass and the detected direction of the window glass, the controller 50 may calculate a real-time location of the window glass. In this case, since a current location of the window glass is always stored in a memory (not shown) in the controller 50, although the user operates the window glass at a later time, the controller 50 may know an initial location of the window glass.

Thus, the controller 50 may detect a speed, a location, and a direction of the window glass based on the one pulse signal generated by the first sensor 20 and the voltage signal detected by the second sensor 30. Although a fault occurs in one of the two hall sensors, the controller 50 may normally perform the safety function.

Figure 2:
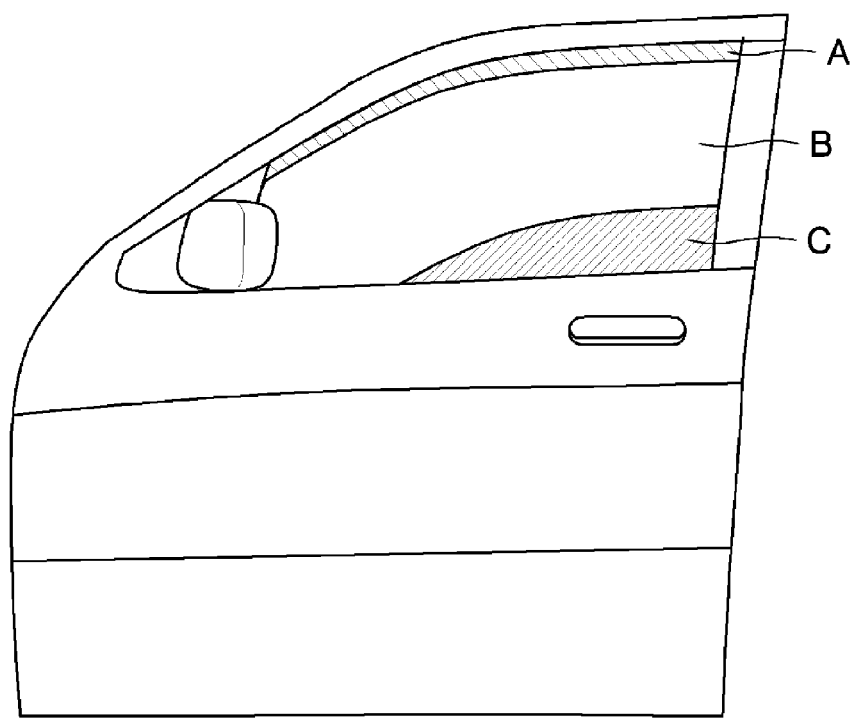
FIG. 2 is a drawing illustrating a safety function used for an embodiment of the present disclosure.

Hereinafter, a description will be given of the safety function with reference to FIG. 2. FIG. 2 is a drawing illustrating a safety function used for an embodiment of the present disclosure.

The safety function may refer to a function of automatically stopping or lowering a window glass if an obstacle is detected while the window glass is being raised.

As shown in FIG. 2, there may be three regions depending on a location of the window glass. Regions A and C may be regions where the safety function is inactivated, and region B may be a region where the safety function is activated. In other words, the safety function may be performed in only region B.

If an obstacle is detected while the window glass is raised in region B, the safety function may be activated. In this case, region B, or the boundaries thereof, may be properly adjusted in consideration of various conditions such as a size of the window glass, a raising/lowering speed of the window glass, and the like. In general, a region of 4 to 200 mm from an upper end of a window may be set to region B.

Since regions A and C are regions where the safety function is inactivated, the window glass may fail to be stopped or lowered even though an obstacle is detected in regions A and C while the window glass is raised and movement of the window glass may be controlled according to a switch operation of the user.

Meanwhile, if a raising speed of the window glass is less than or equal to a threshold value while the window glass is raised, the controller 50 of FIG. 1 may determine that an obstacle is caught and may stop or lower the window glass.

Further, the controller 50 may monitor whether the driving motor 40 of FIG. 1 normally stops or lowers the window glass. If the driving motor 40 does not normally stop or lower the window glass, the controller 50 may again transmit a control signal for safety to the driving motor 40. In other words, if the safety function is not normally performed, the controller 50 may perform the safety function again.

Figure 3:
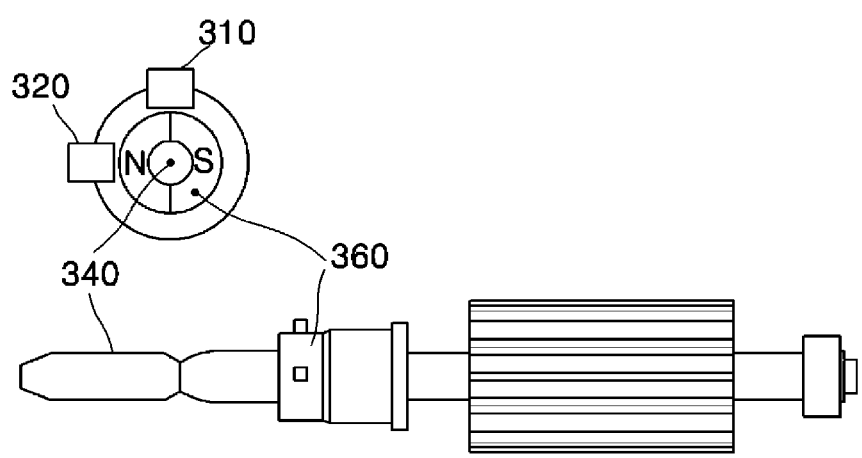
FIG. 3 is a drawing illustrating a structure of a first sensor used for an embodiment of the present disclosure.

FIG. 3 is a drawing illustrating a structure of a first sensor used for an embodiment of the present disclosure.

As shown in FIG. 3, the first sensor 20 used for an embodiment of the present disclosure may include one ring magnet 360 and two hall sensors 310 and 320.

Since the ring magnet 360 is fixedly installed to a rotating shaft 340 of a driving motor 40 of FIG. 1, as the driving motor 40 rotates, the ring magnet 360 may rotate together. The two hall sensors 310 and 320 installed around the periphery of the ring magnet 360 may detect a change in a magnetic field generated as the ring magnet 360 rotates and may generate a pulse signal corresponding to a rotation of the ring magnet 360. In this case, since a window glass moves by a rotation of the driving motor 40, the pulse signal may be a signal corresponding to movement of the window glass.

In an embodiment, the hall sensors 310 and 320 may be installed at an angle difference. For example, since the two hall sensors 310 and 320 are installed at locations having an angle of 90 degrees (i.e., 90 degrees from one another around the periphery of the ring magnet 360), two pulse signals having a phase difference of 90 degrees from each other may be generated. The two generated pulse signals may be used for the controller 50 of FIG. 1 to calculate a location and a direction of the window glass.

In this case, if a fault occurs in one of the two hall sensors 310 and 320, since it is impossible for the hall sensor in which the fault occurs to generate a pulse signal, only the hall sensor in which the fault does not occur may generate a pulse signal. As a result, the first sensor 20 may output only one pulse signal.

In this case, the present disclosure may detect a direction of the window glass based on one pulse signal output from the first sensor 20 and a voltage signal sensed by a second sensor 30 of FIG. 1. The present disclosure may detect a location of the window glass based on a speed of the window glass, detected from the one pulse signal, and the detected direction of the window glass. Finally, the present disclosure may normally perform a safety function by detecting the speed, the location, and the direction of the window glass.

Figure 4:
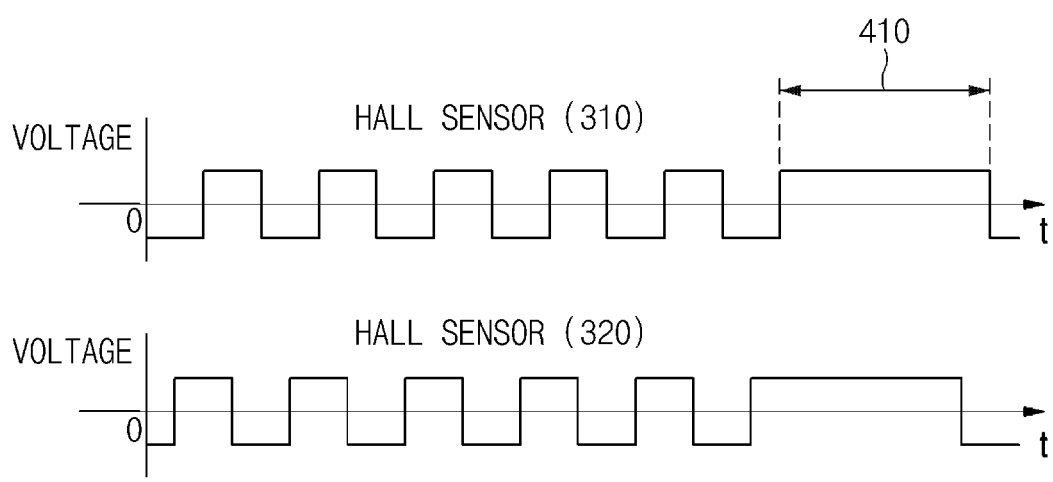
FIG. 4 is a waveform chart illustrating two pulse signals output from a first sensor used for an embodiment of the present disclosure.

FIG. 4 is a waveform chart illustrating two pulse signals output from a first sensor used for an embodiment of the present disclosure.

In FIG. 4, a horizontal axis indicates time and a vertical axis indicates a level (voltage) of a pulse signal. In this case, referring to FIG. 4, a phase difference of 90 degrees is generated between a first pulse signal generated by the hall sensor 310 due to a change in a magnetic field according to a rotation of the ring magnet 360 of FIG. 3 and a second pulse signal generated by the hall sensor 320.

A state where a period (interval) of an initial pulse signal is constant may mean that a window glass is normally opened or closed. A portion 410 where a period of the pulse signal is lengthened may mean that a raising speed of the window is slowed because an obstacle is caught while the window glass is being raised. In other words, if the obstacle is caught while the window glass is being raised, since the driving motor 40 of FIG. 1 receives a load due to the obstacle, a period of a pulse signal may be lengthened.

If a period of a pulse signal of the hall sensor 310 or the hall sensor 320 is suddenly lengthened while the window glass is being raised in region B of FIG. 2, the controller 50 of FIG. 1 may determine that an obstacle is caught and may perform a safety function.

In FIG. 4, if a fault occurs in the one hall sensor 310 between the two hall sensors 310 and 320, the hall sensor 310 in which the fault occurs may fail to generate a pulse signal. Thus, only the other hall sensor 320 may generate a pulse signal. In this case, a pulse signal output from the first sensor 20 of FIG. 1 may be one pulse signal. In other words, the first sensor 20 may generate one pulse signal.

Figure 5:
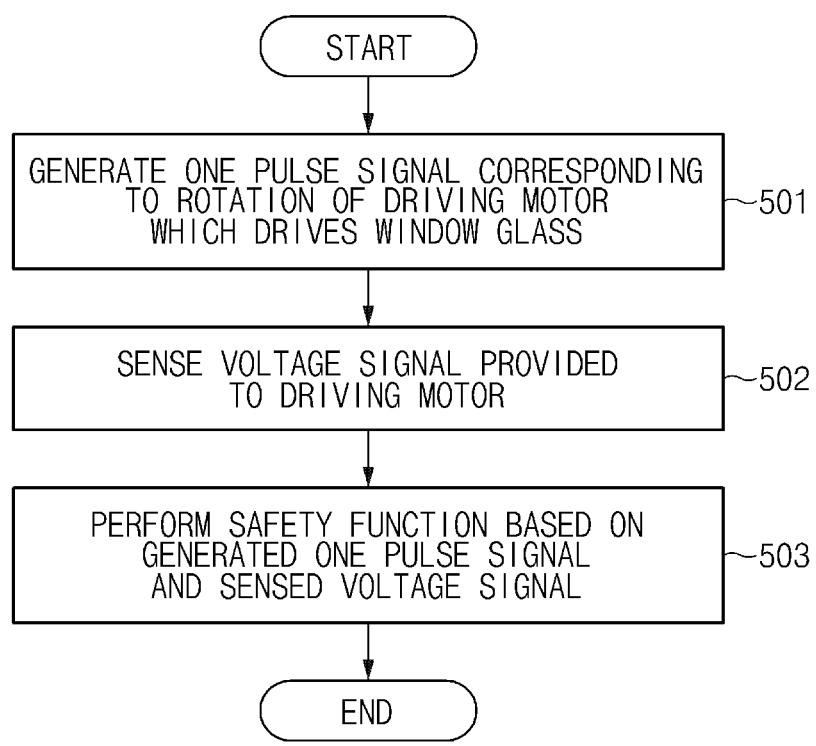
FIG. 5 is a flowchart illustrating a window control method for a vehicle according to an embodiment of the present disclosure.

FIG. 5 is a flowchart illustrating a window control method for a vehicle according to an embodiment of the present disclosure.

First, in operation 501, the first sensor 20 of FIG. 1 may generate one pulse signal corresponding to a rotation of the driving motor 40 of FIG. 1, which drives a window glass. In this case, if a fault occurs in any one of two hall sensors 310 and 320 of the first sensor 20, the first sensor 20 may generate only the one pulse signal. Further, if the first sensor 20 generates only the one pulse signal, the controller 50 of FIG. 1 may determine that the fault occurs in the one hall sensor and may activate a second sensor 30 of FIG. 1.

In operation 502, the second sensor 30 may sense a voltage signal provided to the driving motor 40.

In operation 503, the controller 50 may perform a safety function based on the one pulse signal generated by the first sensor 20 and the voltage signal sensed by the second sensor 30.

The present disclosure relates to technology for detecting a speed, a location, and a direction of a window glass necessary for performing the safety function. Since the technology itself for performing the safety function after such information is detected is generally known technology, a detailed description of such technology has been omitted herein.

The present disclosure may normally perform the safety function even though a fault occurs in one of the two hall sensors by performing the safety function based on a pulse signal generated by the one hall sensor and a voltage signal provided to the driving motor.

Further, the present disclosure may determine whether a movement direction of the window glass is normal, the movement direction detected if both of the two hall sensors are normally functioning, based on a voltage signal provided to the driving motor.

While the present disclosure has been described with reference to specific embodiments, it will be apparent to those having ordinary skill in the art that various changes and modifications may be made without departing from the spirit and scope of the present disclosure.

Therefore, the embodiments of the present disclosure are not limiting, but illustrative, and the spirit and scope of the present disclosure is not limited thereto. The spirit and scope and the present disclosure should be interpreted by the following claims. Further, it should be understood that all technical ideas which are equivalent to the present disclosure are included in the spirit and scope of the present disclosure.

What is claimed is:

1. A device for controlling a window of a vehicle, the device comprising:
   a driving motor configured to drive a window glass;
   a first hall sensor configured to generate a first pulse signal corresponding to a rotation of the driving motor;
   a second hall sensor configured to generate a second pulse signal corresponding to a rotation of the driving motor;
   a voltage sensor configured to sense a voltage signal provided to the driving motor; and
   a controller configured to perform a safety function based on one of only the first pulse signal generated by the first hall sensor and the voltage signal sensed by the voltage sensor or only the second pulse signal generated by the second hall sensor and the voltage signal sensed by the voltage sensor.

2. The device of claim 1, wherein the controller is configured to:
   if a fault occurs in the first hall sensor, perform the safety function based on the second pulse signal generated by the second hall sensor and the voltage signal sensed by the voltage sensor.

3. The device of claim 1, wherein the controller is configured to:
   determine whether the voltage signal provided to the driving motor is a voltage signal for a forward rotation of the driving motor or a voltage signal for a reverse rotation of the driving motor; and
   detect a direction of the window glass.

4. The device of claim 3, wherein the controller is configured to:
   calculate a speed of the window glass using the second pulse signal.

5. The device of claim 4, wherein the controller is configured to:
   detect a real-time location of the window glass based on the speed of the window glass, the direction of the window glass, and a current location of the window glass.

6. The device of claim 5, wherein the controller is configured to:
   determine that an obstacle is caught if a raising speed of the window glass is less than or equal to a threshold value while the window glass is raised; and
   lower the window glass, which is being raised.

7. The device of claim 6, wherein the controller is configured to:
   monitor whether the driving motor lowers the window glass, which is being raised, when performing the safety function; and
   if the window glass, which is being raised, is not lowered, perform the safety function again.

\* \* \* \* \*